US010613409B2

(12) United States Patent
Lee et al.

(10) Patent No.: US 10,613,409 B2
(45) Date of Patent: Apr. 7, 2020

(54) AMPLIFICATION WAVEGUIDE DEVICE AND AMPLIFICATION BEAM STEERING APPARATUS INCLUDING THE SAME

(71) Applicant: SAMSUNG ELECTRONICS CO., LTD., Suwon-si (KR)

(72) Inventors: Eunkyung Lee, Seoul (KR); Byounglyong Choi, Seoul (KR); Jungwoo Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/708,843

(22) Filed: Sep. 19, 2017

(65) Prior Publication Data

US 2018/0217471 A1     Aug. 2, 2018

(30) Foreign Application Priority Data

Feb. 2, 2017  (KR) .................. 10-2017-0015125

(51) Int. Cl.
| | | |
|---|---|---|
| *G02F 1/29* | (2006.01) | |
| *H01S 3/063* | (2006.01) | |
| *H01S 5/028* | (2006.01) | |
| *H01S 5/026* | (2006.01) | |
| *H01S 5/50* | (2006.01) | |

(Continued)

(52) U.S. Cl.
CPC ............ *G02F 1/292* (2013.01); *H01S 3/0632* (2013.01); *H01S 3/0637* (2013.01); *H01S 3/2383* (2013.01); *H01S 5/026* (2013.01); *H01S 5/028* (2013.01); *H01S 5/50* (2013.01); *G02F 2201/30* (2013.01); *G02F 2202/30* (2013.01); *G02F 2203/10* (2013.01); *H01S 3/005* (2013.01); *H01S 3/1608* (2013.01); *H01S 3/2308* (2013.01); *H01S 5/005* (2013.01);

(Continued)

(58) Field of Classification Search
CPC ........................................................ G02F 1/292
See application file for complete search history.

(56) References Cited

U.S. PATENT DOCUMENTS

| | | | |
|---|---|---|---|
| 5,305,412 A * | 4/1994 | Paoli ................. | G02B 6/12004 372/50.1 |
| 6,289,027 B1 * | 9/2001 | Lawrence ............ | G02B 6/124 372/6 |

(Continued)

FOREIGN PATENT DOCUMENTS

KR     2003-0031203 A     4/2003

OTHER PUBLICATIONS

Acoleyen, et al., "Off-chip beam steering with a one-dimensional optical phased array on silicon-on-insulator", May 1, 2009, vol. 34, No. 9, Optics Letters, pp. 1477-1479.

(Continued)

*Primary Examiner* — Sung H Pak
*Assistant Examiner* — Hoang Q Tran
(74) *Attorney, Agent, or Firm* — Sughrue Mion, PLLC

(57) ABSTRACT

An amplification waveguide device and an amplification beam steering apparatus are provided. The amplification beam steering apparatus includes a beam steerer configured to control emission directions of light beams output therefrom, a plurality of waveguides configured to guide the light beams output from the beam steerer, and a light amplifier configured to amplify the light beams traveling through the plurality of waveguides.

18 Claims, 7 Drawing Sheets

(51) Int. Cl.
*H01S 3/23* (2006.01)
*H01S 3/16* (2006.01)
*H01S 5/02* (2006.01)
*H01S 5/00* (2006.01)
*H01S 5/10* (2006.01)
*H01S 5/40* (2006.01)
*H01S 3/00* (2006.01)

(52) U.S. Cl.
CPC ............. *H01S 5/021* (2013.01); *H01S 5/1032* (2013.01); *H01S 5/4056* (2013.01)

(56) References Cited

U.S. PATENT DOCUMENTS

| | | | |
|---|---|---|---|
| 6,807,002 B2 | 10/2004 | Yoon | |
| 6,917,729 B2* | 7/2005 | Zediker | G02B 6/12007 |
| | | | 359/333 |
| 2003/0361203 | 2/2003 | Fukui | |
| 2003/0072343 A1* | 4/2003 | Murray | H01S 3/0627 |
| | | | 372/50.1 |
| 2010/0245987 A1 | 9/2010 | Hasegawa et al. | |
| 2013/0322892 A1 | 12/2013 | Afltatouni et al. | |
| 2015/0049379 A1* | 2/2015 | Doerr | G02B 6/30 |
| | | | 359/334 |
| 2016/0197450 A1 | 7/2016 | Takasaki et al. | |
| 2018/0039153 A1* | 2/2018 | Hashemi | G02F 1/2955 |

OTHER PUBLICATIONS

Spiekman, et al., "Semiconductor optical amplifiers for reconfigurable optical networks (Invited)",Nov. 2007, vol. 6, No. 11, Journal of Optical Networking, pp. 1247-1256.

"Comparison of Different Optical Amplifiers—Tutorials of Fiber Optic Products", Dec. 16, 2014, http://www.fiber-optic-tutorial.com/comparison-ofdifferent-optical-amplifiers.html, 6 pages total.

* cited by examiner

AMPLIFICATION WAVEGUIDE DEVICE AND AMPLIFICATION BEAM STEERING APPARATUS INCLUDING THE SAME

CROSS-REFERENCE TO RELATED APPLICATION

This application claims priority from Korean Patent Application No. 10-2017-0015125, filed on Feb. 2, 2017 in the Korean Intellectual Property Office, the disclosure of which is incorporated herein in its entirety by reference.

BACKGROUND

1. Field

The present disclosure relates to an amplification waveguide device that improves light efficiency by amplifying light and an amplification beam steering apparatus including the amplification waveguide device.

2. Description of the Related Art

To steer or direct laser beams to a desired position, mechanical rotation of a laser-radiating portion and use of interference between a bundle of laser beams output from multiple unit cells or multiple waveguides using an optical phased array (OPA) scheme are generally employed. In the OPA scheme, the unit cells or the waveguides are electrically or thermally controlled to steer the laser beams. The mechanical rotation of the laser-radiating portion uses a motor or a micro electro mechanical system (MEMS), increasing volume and cost. The OPA scheme needs the multiple waveguides, increasing a total volume, and may have an error occurring in phase modulation, and low optical efficiency.

In another way, for beam steering, phase modulation may be performed using a meta device based on plasmon resonance on an interface between metal and an insulator. In this case, two-dimensional (2D) scanning of a reflective beam according to a meta structure of a meta device may be possible, but due to low reflectivity, optical efficiency may also be low.

SUMMARY

One or more example embodiments provide an amplification waveguide device that improves optical efficiency by amplifying light.

One or more example embodiments also provide an amplification beam steering apparatus that improves optical efficiency by amplifying light.

According to an aspect of an example embodiment, there is provided an amplification beam steering apparatus including a beam steerer configured to control emission directions of light beams output therefrom, a plurality of waveguides configured to guide the light beams output from the beam steerer, and a light amplifier configured to amplify the light beams traveling through the plurality of waveguides.

The light amplifier may include a semiconductor optical amplifier or an ion-doped amplifier.

Each of the plurality of waveguides may include a core layer and at least one clad layer, and doping ions are doped in at least one of the core layer and the at least one clad layer.

The doping ions may include erbium (Er).

The amplification beam steering apparatus may further include a coupler configured to couple the light beams from the beam steerer.

The coupler may include at least one of a collimating lens, an optical fiber, and a grating.

Each of the plurality of waveguides may further include a groove configured to receive the coupler.

The light amplifier may include a first conductive layer, a III-V family or II-VI family compound semiconductor layer, and a second conductive layer.

The amplification beam steering apparatus may further include an anti-reflection coating layer provided on each of an incident surface and an emitting surface of the light amplifier.

The light amplifier may be provided above the plurality of waveguides.

The light amplifier may be stacked on the plurality of waveguides.

The beam steerer may be configured to cause the light beams to be incident on the plurality of waveguide from above the plurality of waveguides, and each of the plurality of waveguides may include a first grating on a surface on which a light beam is incident, and a second grating on a surface from which the light beam amplified by the light amplifier is output.

At least one of the plurality of waveguides may have a curved structure.

The light amplifier may include a lower clad layer, an active layer, and an upper clad layer.

The active layer may include InGaAs, InGaNAs, InGaAsP, or InAlGaAs.

The lower clad layer and the upper clad layer may include GaAs, GaP, AlGaAs, InGaP, GaAs, or InP.

The beam steerer may have a meta structure or an optical phased array (OPA) structure.

According to an aspect of another example embodiment, there is provided an amplification waveguide device includes a plurality of waveguides configured to guide light beams and a light amplifier configured to amplify the light beams traveling through the plurality of waveguides.

BRIEF DESCRIPTION OF THE DRAWINGS

The above and/or other aspects will become apparent and more readily appreciated from the following description of example embodiments, taken in conjunction with the accompanying drawings in which.

DETAILED DESCRIPTION

Figure 1:
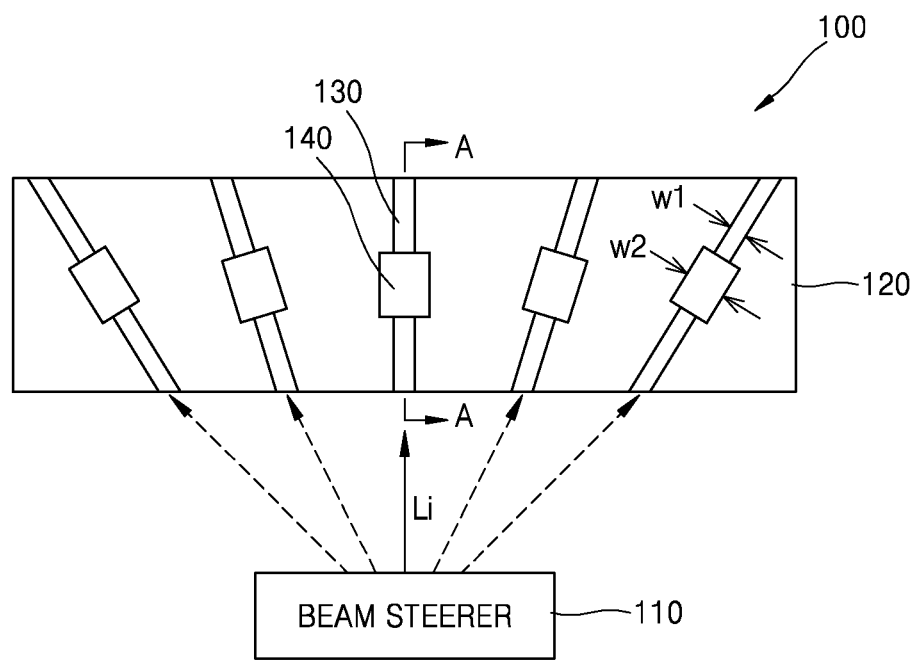
FIG. 1 is a top plan view of an amplification beam steering apparatus according to an example embodiment.

Reference will now be made in detail to example embodiments, examples of which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects. Expressions such as "at least one of," when preceding a list of elements, modify the entire list of elements and do not modify the individual elements of the list.

Hereinafter, with reference to the accompanying drawings, an amplification waveguide device and an amplification beam steering apparatus including the same according to various example embodiments will be described in detail. Throughout the drawings, like reference numerals refer to like elements, and each element may be exaggerated in size for clarity and convenience of a description. Terms such as first, second, and the like may be used to describe various elements, but the elements should not be limited to those terms. These terms may be used for the purpose of distinguishing one element from another element.

The singular forms are intended to include the plural forms as well, unless the context clearly indicates otherwise. If it is assumed that a certain part includes a certain component, the terms "comprising" and 'including' mean that a corresponding component may further include other components unless a specific meaning opposed to the corresponding component is written. Throughout the drawings, each element may be exaggerated in size or thickness for clarity of a description. When it is described that a material layer exists in a substrate or another layer, the material layer may exist in directly contact with the substrate or the another layer or another third layer may exist between them. In the following example embodiments, a material forming each layer is an example, and thus other materials may also be used for the layer.

Figure 2:
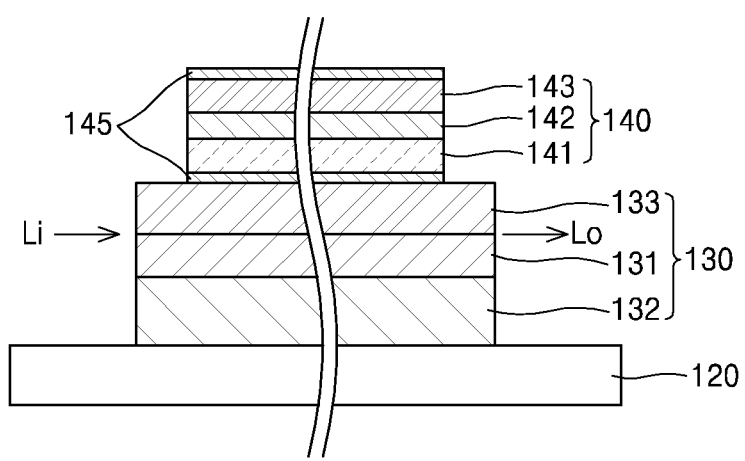
FIG. 2 is a cross-sectional view taken along a line A-A of FIG. 1, according to an example.

FIG. 1 schematically illustrates an amplification beam steering apparatus 100 according to an example embodiment. FIG. 2 is a cross-sectional view taken along a line A-A of FIG. 1, illustrating an example of an amplification waveguide device.

The amplification beam steering apparatus 100 may include a beam steering unit or beam steerer 110, a plurality of waveguides 130 that guide light beams output from the beam steerer 110, and a light amplifier 140 that amplifies the light beams traveling along the waveguides 130. The plurality of waveguides 130 may be provided on a substrate 120. The substrate 120 may be a glass substrate, a silicon substrate, or the like.

The beam steerer 110 is configured to switch or control an emission direction of the light beam. The beam steerer 110 may have a structure that scans a laser based on a micro electric mechanical system (MEMS) scheme, an optical phased array (OPA) structure, or a meta light detection and ranging (lidar) structure. The beam steerer 110 adjusts a traveling direction of a light beam Li, such that the light beam Li is incident on the waveguide 130.

The waveguide 130 and the light amplifier 140 may constitute an amplification waveguide device. The waveguide 130 is arranged to correspond to the traveling direction of the light beam, adjusted by the beam steerer 110. Referring to FIG. 2, the waveguide 130 may include a first clad layer 132, a core layer 131, and a second clad layer 133. The core layer 131 may include a material having a refractive index higher than refractive indices of the first clad layer 132 and the second clad layer 133. The core layer 131 may include a material having a low absorption coefficient for waveguided light. The core layer 131 may include, for example, silicon, silicon oxide, silicon nitride, polymer mineral substances, and so forth. The first clad layer 132 and the second clad layer 133 may include different materials. The first clad layer 132 and the second clad layer 133 may include the same material. The first clad layer 132 and the second clad layer 133 may include silicon oxide, silicon nitride, polymer mineral substances, and so forth. The light amplifier 140 may include a semiconductor optical amplifier or an ion-doped amplifier.

The light amplifier 140 may include, for example, a lower clad layer 141, an active layer 142, and an upper clad layer 143. The lower clad layer 141, the active layer 142, and the upper clad layer 143 may include a III-V family compound semiconductor material or a II-VI family compound semiconductor material. The active layer 142 may include, for example, InGaAs, InGaNAs, InGaAsP, InAlGaAs, and the like. The lower clad layer 141 and the upper clad layer 143 may include a semiconductor material having a band gap larger than a band gap of the active layer 142. The lower clad layer 141 and the upper clad layer 143 may include, for example, GaAs, GaP, AlGaAs, InGaP, GaAs, InP, and so forth. A material of the light amplifier 140 may be selected based on a wavelength (an energy band gap) of light to be amplified. For example, for amplification of light having a wavelength of 1.55 um, an InP/InGaAs material may be used for the lower and upper clad layers 141 and 143 and the active layer 142.

A conductive layer 145 may be provided on each of the lower clad layer 141 and the upper clad layer 143. The conductive layer 145 may include a conductive material. The conductive layer 145 may include, for example, at least one of, an alloy, a stack, etc., selected from a group consisting of Ti, Au, Ag, Pt, Cu, Al, Ni, and Cr. However, without being limited to the above examples, the conductive layer 145 may also include at least one of indium-tin-oxide (ITO), indium-zinc-oxide (IZO), Ga—In—Zn-oxide (GIZO), Al—Zn-oxide (AZO), Ga—Zn-oxide (GZO), and ZnO. The conductive layer 145 may be an electrode alone, or a separate electrode may be coupled to the conductive layer 145 on an outer side of the conductive layer 145.

A semiconductor optical amplifier does not need a separate exciting laser, and amplifies an optical signal by application of an electric field to both sides of a waveguide. When an electric field is applied through the conductive layer 145, absorption and stimulated emission of photons occur, and upon absorption of the photons, electron-hole pairs are generated; whereas, upon coupling of the electron-hole pairs, the stimulated emission of the photons occurs. To amplify an optical signal, the stimulated emission of the photons needs to occur more often than the absorption of the photons. There are two types of semiconductor optical amplifiers: a Fabry-Perot amplifier (FPA) and a traveling wave amplifier (TWA). In the FPA, population inversion occurs due to injected current in a conduction band corresponding to a high energy level, such that stimulated emission occurs due to transition to a valence band corresponding to a low energy level and amplification may be performed by a resonator. In the TWA, both cross-sections of a semiconductor laser are anti-reflection coated to suppress reflection from an emitting surface and resonance is also suppressed, enlarging a gain bandwidth when compared to the FPA type. In the drawings, Li indicates input light and Lo indicates output light.

A width w1 of the light amplifier 140 may be greater than a width w2 of the waveguide 130 (w1<w2). As a result, light bleeding or leakage may be reduced when light transmitted through the waveguide 130 moves toward the light amplifier 140.

Figure 3:
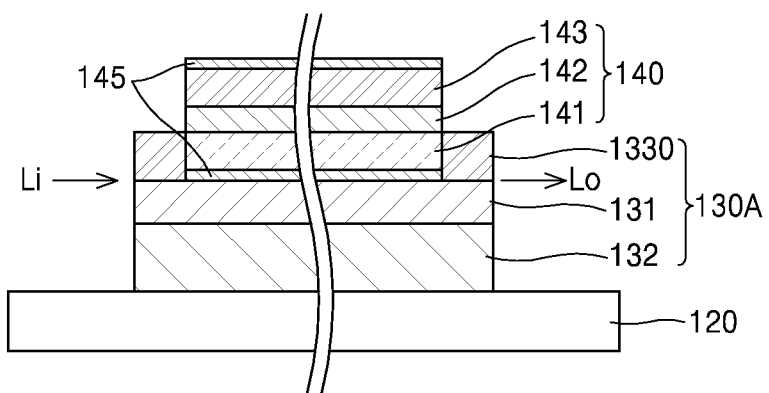
FIG. 3 is a cross-sectional view taken along a line A-A of FIG. 1, according to another example.

FIG. 3 illustrates a modified example of the amplification beam steering apparatus illustrated in FIG. 2. Referring to FIG. 3, a waveguide 130A may include the first clad layer 132 and the core layer 131. Second clad layers 1330 may be provided spaced apart from each other in a light input side and a light output side of the core layer 131. The light amplifier 140 may be arranged between the second clad layers 1330. The conductive layers 145 of the light amplifier 140 and the lower clad layer 141 may be arranged between the second clad layers 1330. However, such a structure is merely an example, and positions of layers may be changed variously. The light amplifier 140 is the same as described with reference to FIG. 2, and thus will not be described in detail. As the core layer 131 and the light amplifier 140 directly contact each other, optical coupling efficiency may be improved.

Figure 4:
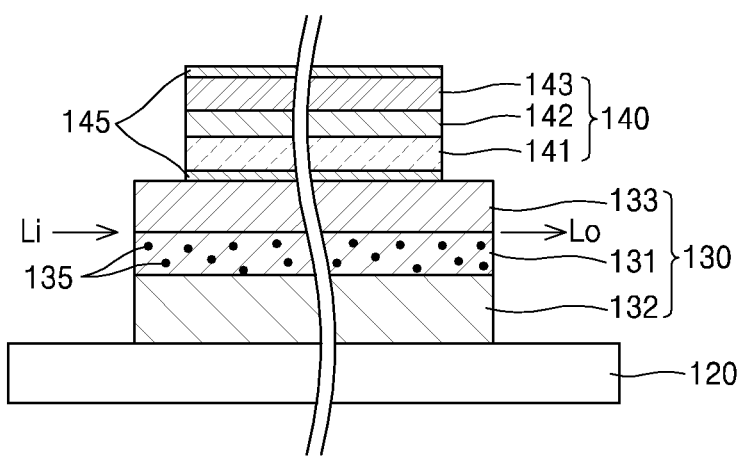
FIG. 4 is a cross-sectional view taken along a line A-A of FIG. 1, according to another example.

FIG. 4 is a schematic diagram illustrating an example where the amplification beam steering apparatus illustrated in FIG. 2 further includes doping ions 135. The core layer 131 may be doped with the doping ions 135. The doping ions 135 may include, for example, erbium (Er). When the core layer 131 includes the doping ions 135, the strength of a light beam passing through the core layer 131 may be amplified. Although only the core layer 131 in FIG. 4 is shown as doped with the doping ions 135 in FIG. 4, the first clad layer 132 and/or the second clad layer 133 may be doped with doping ions, or both the core layer 131 and the first and second clad layers 132 and 133 may also be doped with doping ions.

Figure 5:
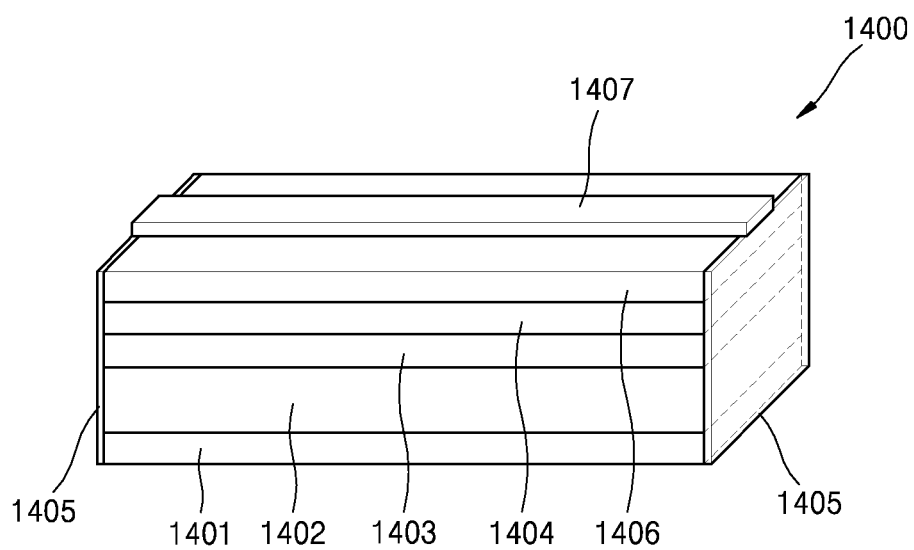
FIG. 5 is a schematic diagram illustrating an example of a light amplifier of an amplification beam steering apparatus according to an example embodiment.

FIG. 5 is a schematic diagram illustrating an example of a light amplifier 1400. The light amplifier 1400 may include a first conductive layer 1401, an n-type clad layer 1403, an active layer 1404, a p-type clad layer 1406, and a second conductive layer 1407. The n-type clad layer 1403, the active layer 1404, the p-type clad layer 1406, and the second conductive layer 1407 may include a III-V family compound semiconductor material or a II-VI family compound semiconductor material.

The first conductive layer 1401 and the second conductive layer 1407 may include, for example, at least one selected from a group consisting of Ti, Au, Ag, Pt, Cu, Al, Ni, and Cr. The n-type clad layer 1403 may be n-type InP, and the p-type clad layer 1406 may be p-type InP. The active layer 1404 may include, for example, an InGaAsP layer. A substrate 1402 may be further included between the first conductive layer 1401 and the n-type clad layer 1403. The substrate 1402 may be an n-type InP substrate.

An anti-reflection coating layer 1405 may be further provided on each of an incident surface and an emitting surface of the light amplifier 1400. The anti-reflection coating layer 1405 may suppress reflection from the emitting surface of the light amplifier 1400 and resonance, thereby increasing gain bandwidth.

Figure 6:
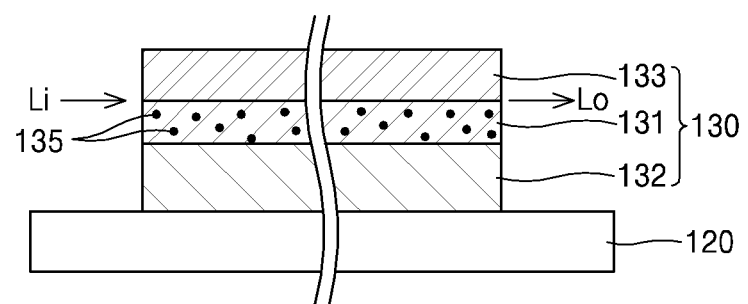
FIG. 6 is a cross-sectional view taken along a line A-A of FIG. 1, according to another example.

FIG. 6 is a schematic diagram illustrating a structure in which the waveguide 130 is doped with ions for amplification. In the current example embodiment, without a separate light amplifier on an outer side of the waveguide 130, internal structures of the waveguide 130 are doped with ions for light amplification. The doping ions 135 may include, for example, erbium (Er). When light is sufficiently amplified using the doping ions 135, the amplification waveguide device may be miniaturized by absence of a separate light amplifier on the outer side of the waveguide 130. At least one of the core layer 131 and the first and second clad layers 132 and 133 may be doped with ions.

Figure 7:
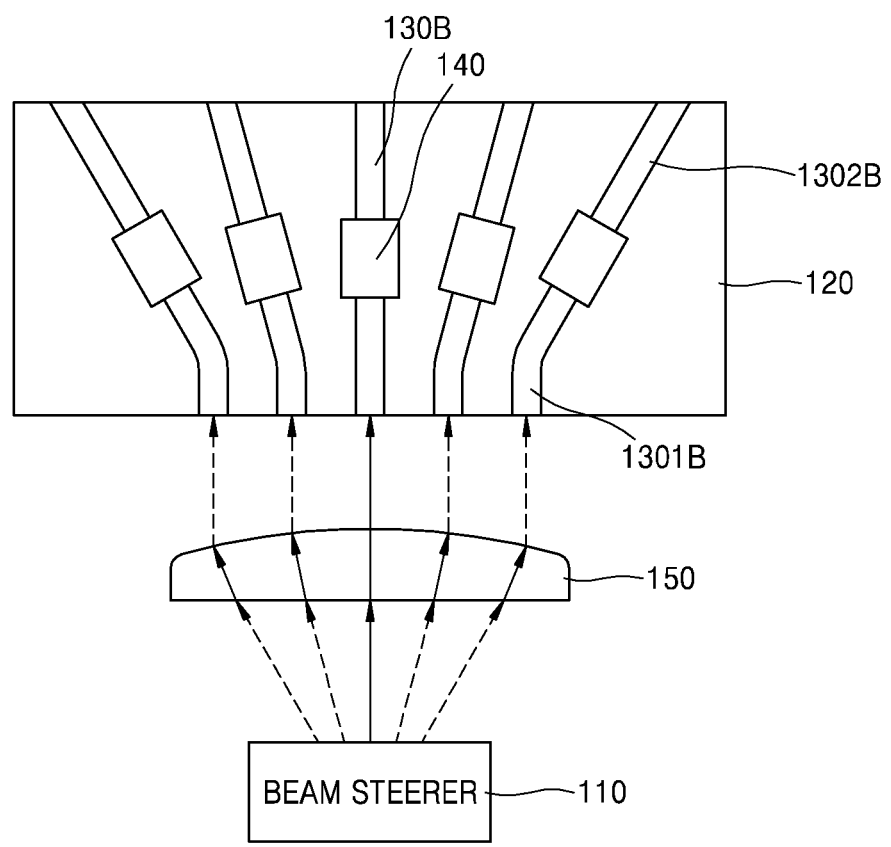
FIG. 7 is a schematic diagram illustrating an example where an amplification beam steering apparatus illustrated in FIG. 1 further includes a collimating lens.

FIG. 7 is a schematic diagram illustrating an example including a coupler 150 between the beam steerer 110 and the waveguides 130B to improve optical coupling efficiency. The coupler 150 may be, for example, a collimating lens. The collimating lens collimates incident light beams, such that the light beams are incident on the waveguides 130B. Hence, optical coupling efficiency of the waveguides 130B may be improved. Through the coupler 150, the light beams may be incident on the waveguides 130B in parallel. The waveguides 130B may include an input section 1301B to which the parallel light beam is incident, and a switching section 1302B that switches the traveling direction of the light beam. The input sections 1301B may be arranged in the same direction as a direction in which light is incident. Between the input section 1301B and the switching section 1302B, a bent portion may be provided, for example, in a curved shape. The curved shape of the bent portion may reduce light loss as compared to an angular shape of a bent portion. The switching sections 1302B may be arranged in the same direction as a beam direction steered by the beam steerer 110. The waveguide 1308 may include at least one amplifier 140, and an amplified light beam may travel in the direction of the waveguide 1308 and be output.

Figure 8:
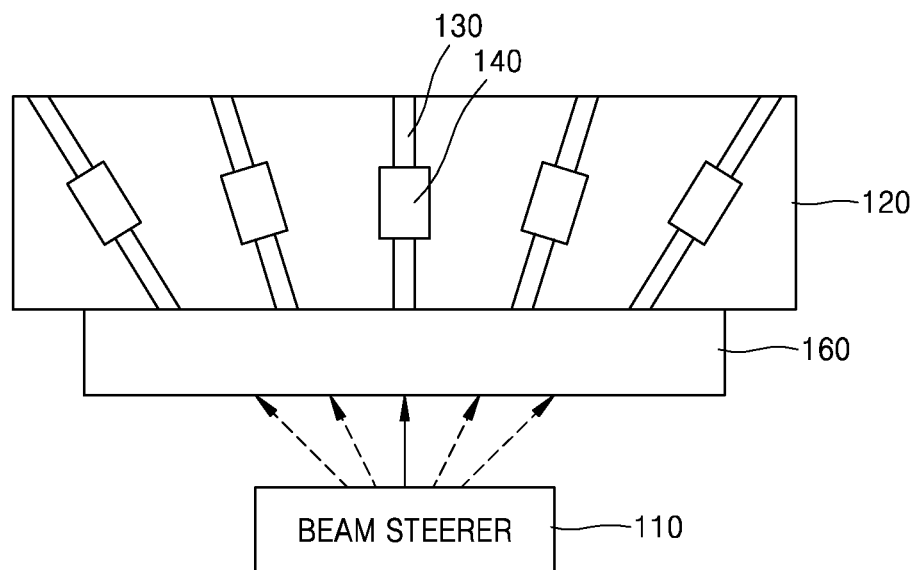
FIG. 8 is a schematic diagram illustrating an example where an amplification beam steering apparatus illustrated in FIG. 1 further includes an optical fiber.

Referring to FIG. 8, an optical fiber 160 may be provided between the beam steerer 110 and the waveguides 130. The optical fiber 160 directly delivers light beams output from the beam steerer 110 to the waveguides 130, thereby improving optical coupling efficiency.

Figure 9:
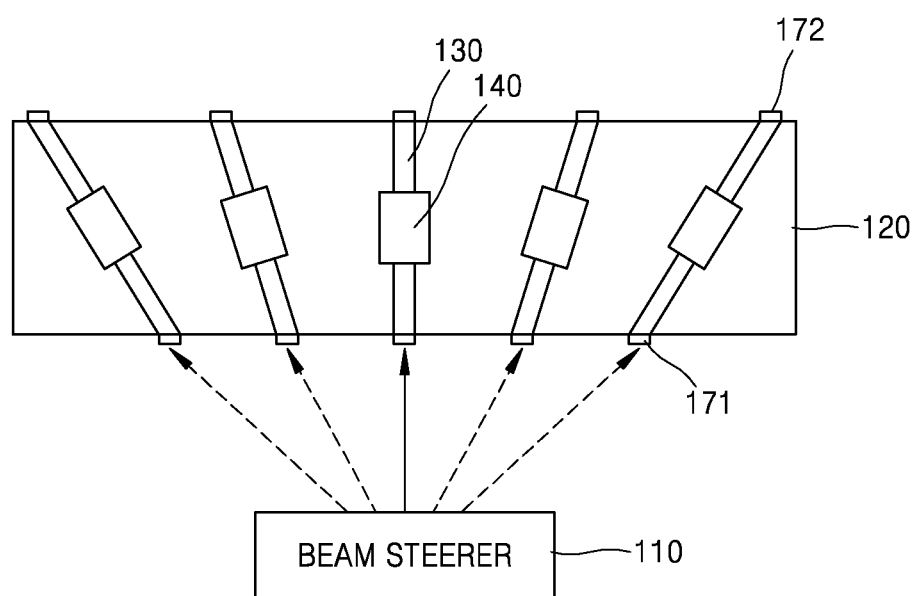
FIG. 9 is a schematic diagram illustrating an example where an amplification beam steering apparatus illustrated in FIG. 1 further includes a grating.

Referring to FIG. 9, a first grating 171 may be provided on the incident surface of the waveguide 130 and a second grating 172 may be provided on the emitting surface of the waveguide 130. The first grating 171 may improve optical coupling efficiency by using diffraction efficiency of incident light. The second grating 172 may improve optical coupling efficiency by using diffraction efficiency of emitted light.

Figure 10:
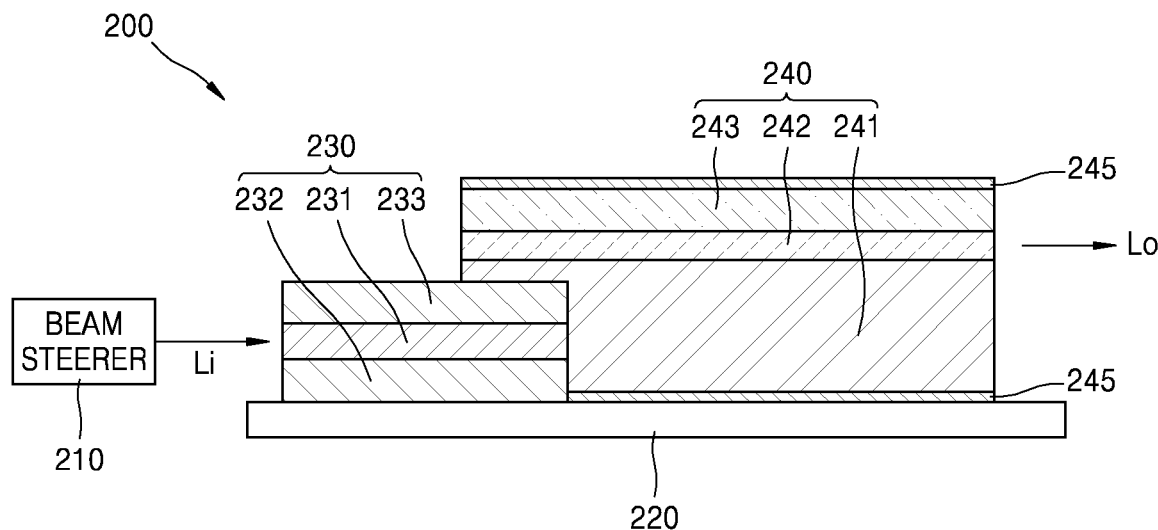
FIG. 10 is a schematic diagram illustrating an amplification beam steering apparatus according to another example embodiment.

FIG. 10 is a schematic diagram illustrating an amplification beam steering apparatus 200 according to an example embodiment. The amplification beam steering apparatus 200 may include a beam steerer 210, a plurality of waveguides 230 that guide light beams incident from the beam steerer 210, and a light amplifier 240 that amplifies the light beams traveling along the waveguides 230. The plurality of waveguides 230 may be provided on a substrate 220. The substrate 220 may be a glass substrate, a silicon substrate, or the like.

The light amplifier 240 may be coupled to the waveguide 230 by overlapping at least a portion of the waveguide 230. The light amplifier 240 may be coupled to the waveguide 230, such that a portion of the light amplifier 240 overlaps an upper portion of the waveguide 230 and the other portion of the light amplifier 240 extends from the waveguide 230.

The beam steerer 210 is configured to switch an emission direction of the light beam. The beam steerer 210 may have a structure that scans a laser based on an MEMS scheme, an OPA structure, or an OPA structure using a meta material. The beam steerer 210 adjusts a traveling direction of a light beam Li, such that the light beam Li is incident on the waveguide 230.

A plurality of waveguides 230 may be arranged to correspond to the traveling directions of the light beams, adjusted by the beam steerer 210. The waveguide 230 may include a first clad layer 232, a core layer 231, and a second clad layer 233. The core layer 231 may include a material having a higher refractive index than those of the first clad layer 232 and the second clad layer 233. The core layer 231 may include, for example, silicon, silicon nitride, or the like. The first clad layer 232 and the second clad layer 233 may include different materials. The first clad layer 232 and the second clad layer 233 may include the same material. The first clad layer 232 and the second clad layer 233 may include silicon oxide, silicon nitride, polymer mineral substances, and so forth.

The light amplifier 240 may include a semiconductor optical amplifier or an ion-doped amplifier. The light amplifier 240 may include, for example, a lower clad layer 241, an active layer 242, and an upper clad layer 243. The active layer 242 may include a semiconductor material. The active layer 242 may include, for example, InGaAs, InGaNAs, InGaAsP, InAlGaAs, and the like. The lower clad layer 241 and the upper clad layer 243 may include a semiconductor material having a larger band gap than that of the active layer 242. The lower clad layer 241 and the upper clad layer 243 may include, for example, GaAs, GaP, AlGaAs, InGaP, GaAs, InP, and so forth.

A conductive layer 245 may be provided on each of the lower clad layer 241 and the upper clad layer 243. The conductive layer 245 may include, for example, at least one selected from a group consisting of Ti, Au, Ag, Pt, Cu, Al, Ni, and Cr. However, without being limited to the above example, the conductive layer 245 may also include at least one of ITO, IZO, GIZO, AZO, GZO, and ZnO.

The incident light Li from the beam steerer 210 is transmitted through the waveguide 230, is amplified by the light amplifier 240, and is output to the outside of the light amplifier 240. In a light transmission path, the incident light Li from the beam steerer 210 is transmitted through the waveguide 230, is delivered to the light amplifier 240, is amplified by the light amplifier 240, and is output from the light amplifier 240. In the current example embodiment, heights of the input light Li and the output light Lo may be adjusted to be different from each other. For high power of the light beam amplified by the light amplifier 240, when the amplified light beam is output through the waveguide 230, the waveguide 230 may be damaged due to the high-power light beam. Thus, as in the current example embodiment, the amplified light beam is directly output to the outside through the light amplifier 240, preventing damage to the waveguide 230.

Figure 11:
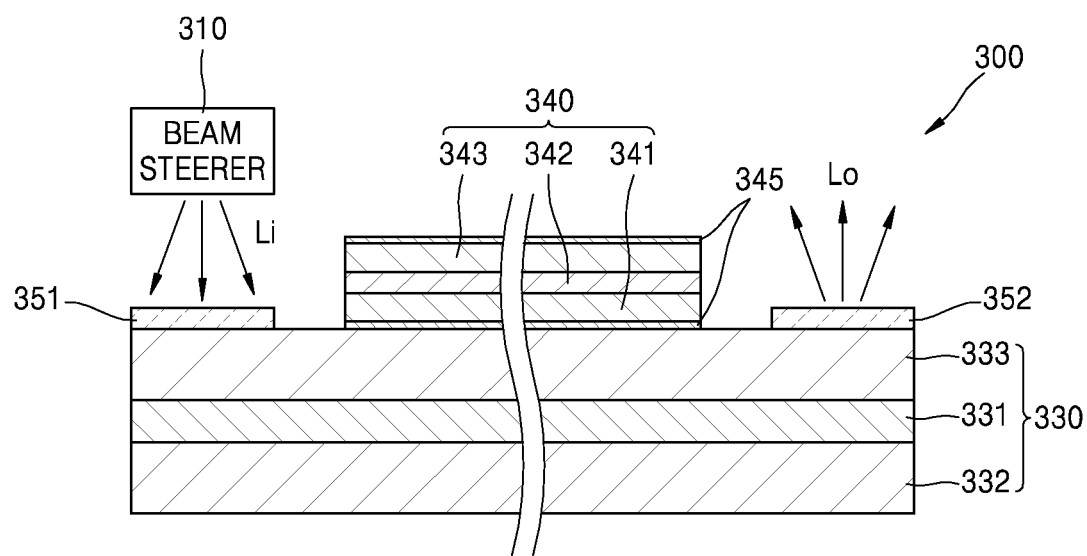
FIG. 11 is a schematic diagram illustrating an amplification beam steering apparatus according to another example embodiment.

FIG. 11 is a schematic diagram illustrating an amplification beam steering apparatus 300 according to another example embodiment. The amplification beam steering apparatus 300 may include a beam steerer 310, a plurality of waveguides 330 that guide light beams incident from the beam steerer 310, and a light amplifier 340 that amplifies the light beams traveling along the waveguides 330. The plurality of waveguides 330 may be provided on a substrate. The substrate may be a glass substrate, a silicon substrate, or the like.

The beam steerer 310 may be arranged above the waveguides 330. A first grating 351 may be provided on a side of an upper surface of the waveguide 330 to which the input light Li from the beam steerer 310 is incident, and a second grating 352 may be provided on the other side of the upper surface of the waveguide 330. The light beam is amplified through the light amplifier 340 and is output through the second grating 352. The first grating 351 may serve as an input coupler, and the second grating 352 may serve as an output coupler.

A plurality of waveguides 330 may be arranged to correspond to the traveling directions of the light beams, adjusted by the beam steerer 310. The waveguide 330 may include a first clad layer 332, a core layer 331, and a second clad layer 333.

The light amplifier 340 may include a semiconductor optical amplifier or an ion-doped amplifier.

The light amplifier 340 may include, for example, a lower clad layer 341, an active layer 342, and an upper clad layer 343. On each of the lower clad layer 341 and the upper clad layer 343, a conductive layer 345 may be provided. The waveguide 330 and the light amplifier 340 perform substantially the same functions and operations as described with reference to FIGS. 1 through 6, and thus will not be described in detail.

The incident light Li from the beam steerer 310 is incident on the waveguide 330 through the first grating 351, is amplified by the light amplifier 340, and is output to the outside through the second grating 352. The input direction and output direction of light may be adjusted by the first grating 351 and the second grating 352. In the case of the absence of the second grating 352, the light may be output in a side direction of the waveguide 330.

Figure 12:
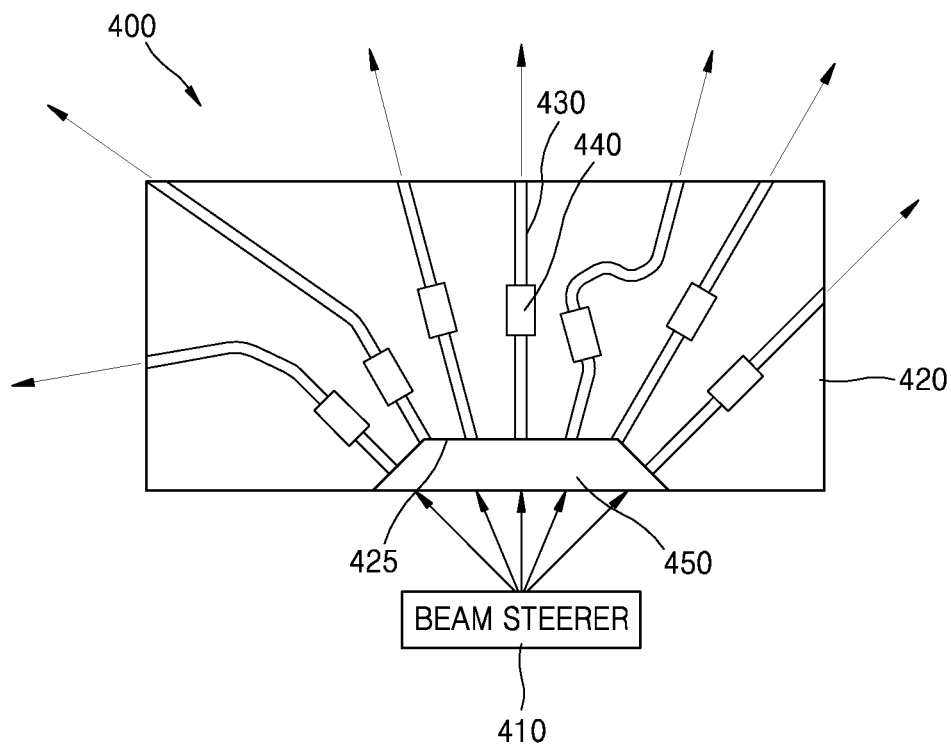
FIG. 12 a schematic diagram illustrating an amplification beam steering apparatus according to another example embodiment.

FIG. 12 is a schematic diagram illustrating an amplification beam steering apparatus 400 according to another example embodiment.

The amplification beam steering apparatus 400 may include a beam steerer 410, a plurality of waveguides 430 that guide light beams incident from the beam steerer 410, and a light amplifier 440 that amplifies the light beams traveling along the waveguides 430. The plurality of waveguides 430 may be provided on a substrate 420. The substrate 420 may be a glass substrate, a silicon substrate, or the like. A coupler 450 may be provided between the beam steerer 410 and the waveguides 430. The coupler 450 may include a coupling groove 425 for receiving and coupling the coupler 450 to the incident surface of the waveguide 430. Although the coupler 450 may be coupled to the waveguide 430 without the coupling groove 425, space utilization may be improved by including the coupling groove 425. The coupler 450 may include, for example, a collimating lens, an optical fiber, a grating, and so forth. The internal structures of the waveguide 430 and the light amplifier 440 perform substantially the same functions and operations as described with reference to FIGS. 1 through 6, and thus will not be described in detail. The waveguide 430 and the light amplifier 440 may have curved structures. The waveguide 430 and the light amplifier 440 may variously adjust a path of light according to the curved structures. As illustrated in FIG. 12, by selectively arranging the curved structures and straight structures of the waveguides 430 and the light amplifiers 440, output directions of light may be adjusted at various angles, broadening a light steering range.

Figure 13:
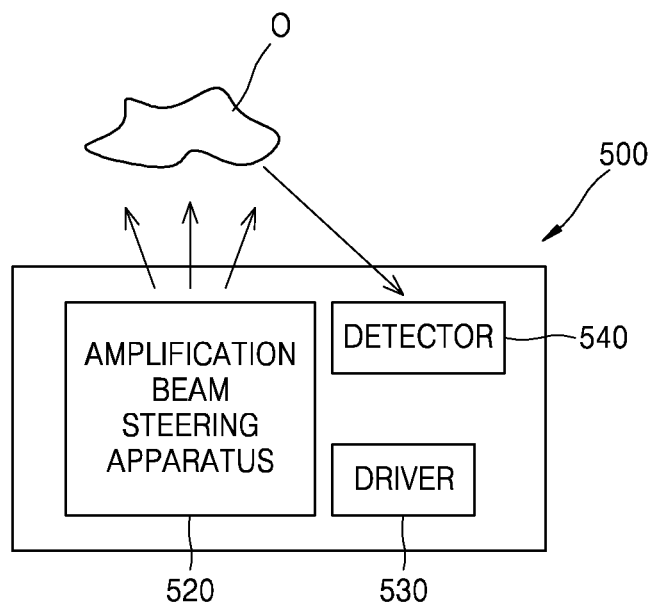
FIG. 13 a schematic diagram illustrating a system including an amplification beam steering apparatus according to various example embodiments.

Referring to FIG. 13, a system 500 according to an example embodiment may include an amplification beam steering apparatus 520, a driver 530, and a detector 540 that detects a beam of a steered beam reflected from an object O.

The driver 530 may include a driving circuit that drives the amplification beam steering apparatus 520 and the detector 540.

The amplification beam steering apparatus 520 amplifies an incident beam and steers the amplified beam to a desired position. The amplification beam steering apparatus 520 may include the amplification beam steering apparatuses 100, 200, 300, and 400 described above according to various example embodiments. Once the beam steered by the amplification beam steering apparatus 520 is radiated to and reflected from the object O, the detector 540 detects the reflected beam. The system 500 to which the amplification beam steering apparatus 520 is applied may be applied to various devices such as, for example, a depth sensor, a three-dimensional (3D) sensor, lidar, etc. The lidar radiates a laser to a target object to sense a distance to the object, a direction, a speed, a temperature, a material distribution, and a concentration of the object, and so forth. The lidar has been used in a laser scanner and a 3D image camera for autonomous vehicles. Measurement using the lidar may include a time of flight (ToF) scheme that measures a distance by using a difference in arrival time of a reflected signal of a laser pulse signal in a reception end and a phase shift scheme that measures a reflection phase variation of a laser beam modulated at a particular frequency.

The amplification beam steering apparatus according to various example embodiments may be applied to an autonomous vehicle, a flying object like a drone, a mobile device, a bicycle, a motorcycle, a stroller, small walking means like a board, etc., a robot, Internet of things, a building security system, a 3D imaging device, and so forth. The amplification beam steering apparatus according to various example embodiments may also be applied to various daily supplies such as a walking stick, a helmet, clothing, an accessory, a watch, a bag, and so forth.

The above-described embodiments are merely examples, and those of ordinary skill in the art may make various modifications and other equivalent embodiments therefrom. Therefore, the true technical protection range according to the example embodiments should be defined by the technical spirit of the disclosure of the claims.

It should be understood that example embodiments described herein should be considered in a descriptive sense only and not for purposes of limitation. Descriptions of features or aspects within each embodiment should typically be considered as available for other similar features or aspects in other embodiments.

While example embodiments have been described with reference to the figures, it will be understood by those of ordinary skill in the art that various changes in form and details may be made therein without departing from the spirit and scope as defined by the following claims.

What is claimed is:

1. An amplification beam steering apparatus comprising:
   a beam steerer configured to control emission directions of light beams output therefrom;
   a plurality of waveguides configured to guide the light beams output from the beam steerer; and
   a light amplifier configured to amplify the light beams output from the beam steerer and traveling through the plurality of waveguides,
   wherein at least one of the plurality of waveguides has a curved structure such that output ports of the plurality of waveguides face in different directions from each other to broaden a light steering range, and a width of the light amplifier is greater than a width of each of the plurality of waveguides.

2. The amplification beam steering apparatus of claim 1, wherein the light amplifier comprises a semiconductor optical amplifier or an ion-doped amplifier.

3. The amplification beam steering apparatus of claim 1, wherein each of the plurality of waveguides comprises a first clad layer, a second clad layer, and a core layer disposed between the first clad layer and the second clad layer, and
   wherein a refractive index of the core layer is higher than refractive indices of the first clad layer and the second clad layer.

4. The amplification beam steering apparatus of claim 3, wherein at least one of the core layer, the first clad layer and the second clad layer is doped with doping ions comprising erbium (Er).

5. The amplification beam steering apparatus of claim 1, further comprising a coupler configured to couple the light beams from the beam steerer, such that light beams output from the coupler are incident on the light amplifier.

6. The amplification beam steering apparatus of claim 5, wherein the coupler comprises at least one of a collimating lens, an optical fiber, and a grating.

7. The amplification beam steering apparatus of claim 5, wherein each of the plurality of waveguides comprises a groove configured to receive the coupler.

8. The amplification beam steering apparatus of claim 1, wherein the light amplifier comprises a first conductive layer, a III-V family or II-VI family compound semiconductor layer, and a second conductive layer.

9. The amplification beam steering apparatus of claim 1, further comprising an anti-reflection coating layer provided on each of an incident surface and an emitting surface of the light amplifier.

10. The amplification beam steering apparatus of claim 1, wherein the light amplifier is provided above the plurality of waveguides.

11. The amplification beam steering apparatus of claim 1, wherein the light amplifier is stacked on the plurality of waveguides.

12. The amplification beam steering apparatus of claim 1, wherein the beam steerer is configured to cause the light beams to be incident on the plurality of waveguides from above the plurality of waveguides, and
   each of the plurality of waveguides comprises a first grating on a surface on which a light beam is incident, and a second grating on a surface from which the light beam amplified by the light amplifier is output.

13. The amplification beam steering apparatus of claim 1, wherein the light amplifier comprises a lower clad layer, an active layer, and an upper clad layer.

14. The amplification beam steering apparatus of claim 13, wherein the active layer comprises InGaAs, InGaNAs, InGaAsP, or InAlGaAs.

15. The amplification beam steering apparatus of claim 13, wherein each of the lower clad layer and the upper clad layer comprises GaAs, GaP, AlGaAs, InGaP, GaAs, or InP.

16. The amplification beam steering apparatus of claim 1, wherein the beam steerer has a meta structure or an optical phased array (OPA) structure.

17. The amplification beam steering apparatus of claim 1, wherein a core layer of the plurality of waveguides is in direct contact with the light amplifier.

18. The amplification beam steering apparatus of claim 1, further comprising a coupler configured to couple the light beams from the beam steerer, wherein the output ports of the plurality of waveguides are arranged radially around the coupler.

* * * * *